(12) United States Patent
Song et al.

(10) Patent No.: US 10,097,215 B2
(45) Date of Patent: Oct. 9, 2018

(54) ELECTRONIC DEVICE AND METHOD OF CONTROLLING TRANSMISSION POWER

(71) Applicant: Samsung Electronics Co., Ltd., Gyeonggi-do (KR)

(72) Inventors: Seongjun Song, Gyeonggi-do (KR);
Kyunghwan Jo, Jeollanam-do (KR);
Youngseok Song, Gyeonggi-do (KR);
Sungchul Park, Seoul (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 15/071,818

(22) Filed: Mar. 16, 2016

(65) Prior Publication Data

US 2016/0277044 A1 Sep. 22, 2016

(30) Foreign Application Priority Data

Mar. 16, 2015 (KR) ........................ 10-2015-0036219

(51) Int. Cl.
| | |
|---|---|
| *H03C 1/62* | (2006.01) |
| *H04B 1/04* | (2006.01) |
| *H03F 3/24* | (2006.01) |
| *H03F 1/30* | (2006.01) |
| *H03F 3/19* | (2006.01) |

(52) U.S. Cl.
CPC ............... *H04B 1/04* (2013.01); *H03F 1/30* (2013.01); *H03F 3/19* (2013.01); *H03F 3/245* (2013.01); *H03F 2200/447* (2013.01); *H03F 2200/451* (2013.01); *H03F 2200/468* (2013.01); *H04B 2001/0416* (2013.01)

(58) Field of Classification Search
None
See application file for complete search history.

(56) References Cited

U.S. PATENT DOCUMENTS

| | | | | |
|---|---|---|---|---|
| 5,081,713 | A * | 1/1992 | Miyazaki | H03G 3/3042 455/115.1 |
| 5,893,036 | A * | 4/1999 | Trandai | H04W 52/367 455/522 |
| 6,563,883 | B1 * | 5/2003 | Leinonen | H03G 3/3042 375/146 |
| 7,554,407 | B2 | 6/2009 | Hau et al. | |
| 9,048,787 | B2 * | 6/2015 | Jones | H03F 1/0227 |
| 2005/0227646 | A1 * | 10/2005 | Yamazaki | H03F 3/45192 455/127.3 |
| 2006/0229036 | A1 * | 10/2006 | Muller | H03F 1/3282 455/114.3 |
| 2008/0102767 | A1 * | 5/2008 | Camuffo | H04B 1/0475 455/127.1 |
| 2009/0298415 | A1 * | 12/2009 | Gudem | H03F 1/0244 455/574 |
| 2009/0325517 | A1 * | 12/2009 | Fan | H03G 3/3042 455/127.2 |

(Continued)

*Primary Examiner* — Lana N Le
(74) *Attorney, Agent, or Firm* — The Farrell Law Firm, P.C.

(57) ABSTRACT

A transmission power control method and an electronic device capable of adjusting a bias of a power amplifier are provided. The electronic device includes: a temperature sensor; a power amplifier (PA); and a controller configured to monitor signals from the temperature sensor, determine a bias value for the PA, based on the monitored signals, and control the PA to amplify a signal for transmission based on the determined bias value.

15 Claims, 7 Drawing Sheets

(56) References Cited

U.S. PATENT DOCUMENTS

| | | | |
|---|---|---|---|
| 2010/0056080 A1* | 3/2010 | Sato | H04B 1/04 455/108 |
| 2012/0146730 A1* | 6/2012 | Signoff | H03F 1/30 330/279 |
| 2018/0145718 A1* | 5/2018 | Margomenos | H04B 1/40 |

* cited by examiner

ELECTRONIC DEVICE AND METHOD OF CONTROLLING TRANSMISSION POWER

PRIORITY

This application claims priority under 35 U.S.C. § 119(a) to Korean Patent Application Serial No. 10-2015-0036219, which was filed in the Korean Intellectual Property Office on Mar. 16, 2015, the entire disclosure of which is incorporated herein by reference.

BACKGROUND

1. Field of the Invention

The present invention relates generally to transmission power control systems, and more particularly, to a transmission power control method and an electronic device capable of adjusting a bias of a power amplifier (PA).

2. Description of Related Art

Recent communication systems have provided multimedia services requiring the transmission of relatively large volumes of data, which increases signal complexity and necessitates the use of broadband signals.

Communication systems include a transmitter (Tx) for transmitting signals and a receiver (Rx) for receiving signals. The transmitter includes a PA that amplifies the power of a transmission signal.

A PA affects the communication system in terms of transmission performance and current consumption. For example, when a high bias is applied to the PA in order to improve the transmission performance of an electronic device, the amount of current also increases in the PA, thus increasing current consumption during a call.

Accordingly, there are issues between the improvement of transmission performance and the reduction of current consumption. Therefore, a system is required to improve both the transmission performance and the efficiency of a PA, thereby reducing the current consumption.

SUMMARY

The present invention has been made to address at least the above-described problems and disadvantages, and to provide at least the advantages described below.

Accordingly, an aspect of the present invention is to provide a system that varies a bias applied to a PA according to changes in temperature; and adjusts the bias applied to the PA, as an offset condition, according to operation conditions and states of an electronic device, in order to improve transmission performance and reduce current consumption of the electronic device during a call.

In accordance with an aspect of the present invention, an electronic device is provided. The electronic device includes a temperature sensor; a power amplifier (PA); and a controller configured to monitor signals from the temperature sensor, determine a bias value for the PA, based on the monitored signals, and control the PA to amplify a signal for transmission based on the determined bias value.

In accordance with another aspect of the present invention, an electronic device is provided. The electronic device includes a temperature sensor; a radio frequency (RF) process module configured to convert an input signal into an RF signal; a power amplifier (PA) configured to amplify the RF signal transferred from the RF process module; and a controller configured to determine a transmission level for a transmission signal, measure a temperature via the temperature sensor, when the determined transmission level is less than or equal to a threshold level, select a bias value for the PA, based on the measured temperature, and control the PA to amplify according to the selected bias value.

In accordance with another aspect of the present invention, a method of controlling transmission power is provided. The method includes determining a temperature surrounding a power amplifier (PA); selecting a bias value for the PA based on the determined temperature; and controlling the PA based on the selected bias value.

In accordance with another aspect of the present invention, a method of controlling transmission power is provided. The method includes determining a transmission level for a transmission signal; measuring a surrounding temperature a power amplifier (PA), when the determined transmission level is less than or equal to a threshold level; selecting a bias value for the PA, based on the measured surrounding temperature; and controlling the PA to amplify the transmission signal based on the selected bias value.

BRIEF DESCRIPTION OF THE DRAWINGS

The above and other aspects, features, and advantages of certain embodiments of the invention will be more apparent from the following detailed description, taken in conjunction with the accompanying drawings, in which.

DETAILED DESCRIPTION OF EMBODIMENTS OF THE INVENTION

Figure 1:
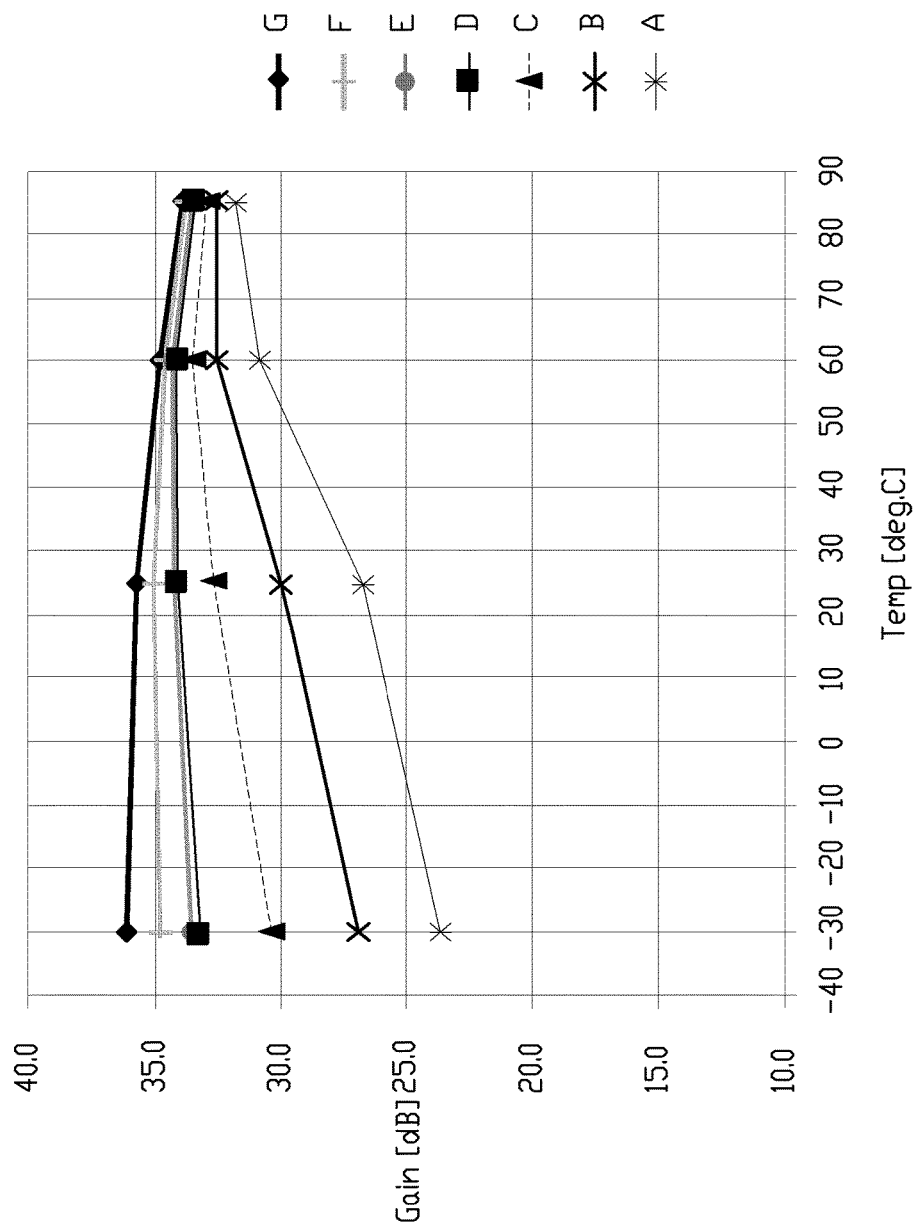
FIG. 1 is a gain characteristic graph of a power amplifier according to temperature changes in an electronic device.

Various embodiments of the present invention will be described in detail with reference to the accompanying drawings. It will be appreciated by those skilled in the art that various modifications, additions, and substitutions are possible from the embodiments of the invention that are illustrated and described in detail herein, and that the scope of the invention should not be limited to the following embodiments.

The embodiments of the present invention are provided such that those skilled in the art completely understand the invention. It should be understood that the invention may include all modifications and/or equivalents and/or substations included in the idea and technical scope of the present disclosure.

In the drawings, the same or similar elements may be denoted by the same reference numerals even though they are depicted in different drawings.

Herein, different terms are used for the purpose of describing particular embodiments and are not intended to limit the present disclosure.

Singular forms are intended to include plural forms unless the context clearly indicates otherwise.

Unless defined otherwise, all terms used herein, including technical terms and scientific terms, have the same meanings as commonly understood by a person of ordinary skill in the art to which the present disclosure pertains. Such terms as those defined in a generally used dictionary are to be interpreted to have meanings that are consistent with the contextual meanings in the relevant field of art, and are not to be interpreted to have ideal or excessively formal meanings unless clearly defined as such in the present disclosure.

Herein, an electronic device may be a device that involves a communication function, e.g., a smart phone, a tablet personal computer (PC), a mobile phone, a video phone, an e-book reader, a desktop PC, a laptop PC, a netbook computer, a personal digital assistant (PDA), a portable multimedia player (PMP), an MP3 player, a portable medical device, a digital camera, or a wearable device (e.g., a head-mounted device (HMD), electronic glasses, electronic clothes, an electronic bracelet, an electronic necklace, an electronic appcessory, an electronic tattoo, a smart mirror, or a smart watch).

An electronic device may also be a smart home appliance that involves a communication function, e.g., a television (TV), a digital video disk (DVD) player, audio equipment, a refrigerator, an air conditioner, a vacuum cleaner, an oven, a microwave, a washing machine, an air cleaner, a set-top box, a home automation control panel, a security control panel, a TV box (e.g., Samsung HomeSync®, Apple TV®, Google TV®, etc.), a game console, an electronic dictionary, an electronic key, a camcorder, or an electronic picture frame.

An electronic device may also be a medical device (e.g., a portable medical measuring device, such as a blood glucose monitoring device, a heart rate monitoring device, a blood pressure measuring device, a body temperature measuring device, etc., a magnetic resonance angiography (MRA) device, a magnetic resonance imaging (MRI) device, a computed tomography (CT) machine, and an ultrasonic machine), a navigation device, a global positioning system (GPS) receiver, a global navigation satellite system (GNSS), an event data recorder (EDR), a flight data recorder (FDR), a vehicle infotainment device, an electronic device for a ship (e.g., a navigation device for a ship, and a gyro-compass), avionics, security devices, an automotive head unit, a robot for home or industry, an automatic teller machine (ATM), a point of sales (POS) device in a shop, or an Internet of Things (IoT) device (e.g., a light bulb, various sensors, electric or gas meter, a sprinkler device, a fire alarm, a thermostat, a streetlamp, a toaster, a sporting goods, a hot water tank, a heater, a boiler, etc.).

An electronic device may also be furniture or part of a building or construction having a communication function, an electronic board, an electronic signature receiving device, a projector, or various measuring instruments (e.g., a water meter, an electric meter, a gas meter, a wave meter, etc.).

An electronic device herein may also be one of the above-mentioned devices or any combination thereof.

FIG. 1 is a gain characteristic graph of a power amplifier according to temperature changes in an electronic device. In the following description, it is assumed that the electronic device is a communication device in a communication system, but is not limited thereto.

Referring to FIG. 1, the communication device controls a PA to amplify a signal into a signal of significant power, or an amplified power signal, and controls the antenna to transmit the amplified power signal. The PA may amplify a signal into another signal of a gain, e.g., a radio frequency (RF) signal.

Herein, the term "gain" refers to a ratio of output voltage to input voltage. The gain is expressed in decibels (dB). Further, the gain of a PA may be referred to as a "PA gain" or an "amplification gain".

The communication device may set a bias value of a PA (hereafter referred to as a "PA bias value") to achieve a transmission power required for a communication network (e.g., transmission power that meets the Global System for Mobile Communications (GSM) 3rd Generation Partnership Project (3GPP) standard) and may drive the PA with the set PA bias value. The PA bias value may be a digital value.

The communication device may perform a control operation to apply a bias value corresponding to a digital value to the PA.

When the communication device amplifies power, the PA gain characteristic is reduced in a low temperature environment.

As illustrated in FIG. 1, the PA gains are obtained as the PA performs power amplification with different PA bias values, according to temperature conditions. Characteristic graphs 'A', 'B', 'C', 'D', 'E', 'F' and 'G' reflect PA gains measured when the PA bias values are set to 0x00, 0x33, 0x66, 0x99, 0xAA, 0xCC, and 0xFF, respectively. The PA gains increase according to the PA bias values, which also increase in order from 'A' to 'F'.

When power amplifiers amplify an input signal using the same PA bias value and may maintain the same PA gain characteristic, they may be ideal. However, as illustrated in FIG. 1, the PA gain characteristics vary according to temperature changes. In particular, the smaller the PA bias value, the lower the PA gain characteristic. For example, while characteristic graphs 'D' and 'E' show that the PA performs power amplification with a constant PA gain at low temperature, room temperature, and high temperature, regardless of temperature changes, characteristic graphs 'A' and 'B' show that the PA gain is suddenly lowered in a low temperature environment.

Table 1 below shows measurement results of transmission powers that a PA outputs with a PA bias value corresponding to a transmission level.

TABLE 1

| Test Item | Min | Max | Unit | +50° C. | +35° C. | −20° C. |
|---|---|---|---|---|---|---|
| TX Power @ Lvl 5 | 31 | 35 | dBm | 32.32 | 32.07 | 31.79 |
| TX Power @ Lvl 6 | 28 | 34 | dBm | 30.99 | 30.91 | 30.51 |
| TX Power @ Lvl 7 | 27 | 31 | dBm | 29.45 | 29.16 | 28.59 |
| TX Power @ Lvl 8 | 24 | 30 | dBm | 27.53 | 27.27 | 26.54 |
| TX Power @ Lvl 9 | 22 | 28 | dBm | 25.8 | 25.57 | 24.58 |
| TX Power @ Lvl 10 | 20 | 26 | dBm | 23.81 | 23.44 | 22.59 |
| TX Power @ Lvl 11 | 18 | 24 | dBm | 21.6 | 21.36 | 20.65 |
| TX Power @ Lvl 12 | 16 | 22 | dBm | 19.68 | 19.4 | 18.42 |
| TX Power @ Lvl 13 | 14 | 20 | dBm | 17.72 | 17.4 | 16.19 |
| TX Power @ Lvl 14 | 12 | 18 | dBm | 15.86 | 14.16 | 6.14 |
| TX Power @ Lvl 15 | 10 | 16 | dBm | 14.27 | 12.41 | 4.1 |
| TX Power @ Lvl 16 | 6 | 16 | dBm | 12.7 | 10.79 | 1.82 |
| TX Power @ Lvl 17 | 4 | 14 | dBm | 10.72 | 8.71 | −0.05 |
| TX Power @ Lvl 18 | 2 | 12 | dBm | 8.7 | 6.89 | −2.09 |
| TX Power @ Lvl 19 | 0 | 10 | dBm | 6.91 | 5.08 | −0.05 |

In Table 1, the 'test item' refers to transmission levels, and Min and Max refer to respective minimum and maximum transmission outputs according to a corresponding transmission level. As shown in Table 1, in transmission levels 5 to 13, the PA amplifies power to similar transmission outputs in temperature environments of +50° C., +35° C., and −20° C.

That is, in transmission levels 5 to 13, the PA has amplified power to similar transmission outputs, regardless of temperature changes, and thus maintains a constant PA gain characteristic.

In transmission levels 14 to 19, the PA amplifies power to similar transmission outputs in temperature environments of +50° C. and +35° C.; however, the transmission output is suddenly lowered in a temperature environment of −20° C. For example, in transmission level 15, the standard transmission power is minimum 10 dBm and maximum 16 dBm.

As shown in table 1, transmission level 15 shows that the transmission power is measured as 14.27 dBm and 12.4 dBm at a room temperature and is lowered to 4.1 dBm in a low temperature environment. That is, in transmission levels 14 to 19, the PA gain characteristic of a PA is lowered in a low temperature environment.

In order to resolve the lowering of transmission power in a low temperature environment in transmission levels 14 to 19, the communication system may be set to increase a PA bias value, in order to amplify power.

Table 2 below shows measurement results of current consumption during a call, as PA bias values applied to PAs in two electronic devices are altered.

TABLE 2

| PA bias value | Transmission level 15 | | Transmission level 19 | |
| --- | --- | --- | --- | --- |
| 0x00 | 13.4 dBm | 119.9 mA | 5.3 dBm | 107.9 mA |
| 0x88 | 13.4 dBm | 148.9 mA | 5.4 dBm | 145.9 mA |
| 0xAA | 13.6 dBm | 190.0 mA | 5.5 dBm | 187.9 mA |

As shown in Table 2, transmission levels 15 to 19 show that current consumption during a call increases. For example, for a signal amplified in transmission level 15 as the PA bias value is increased to 0x00, 0x88, and 0xAA, when transmission power is amplified with a PA bias value 0xAA, the current consumption during a call is 190.0 mA, increasing in approximately 70 mA, compared with a PA bias value of 0x00. For transmission level 19, when transmission power is amplified with a PA bias value of 0xAA and a signal of the amplified power is output, the current consumption is measured as 187.9 mA, increasing in approximately 80 mA, compared with the PA bias value of 0x00.

In the following description of various embodiments of the present invention, transmission power control methods and devices are provided, which are capable of: selecting or adjusting a PA bias value of a PA according to operation conditions or states of a terminal, a transmission level, etc.; and controlling the transmission output, in order to prevent transmission power from lowering or to avoid a current consumption increase during a call in a low temperature environment.

Figure 2:
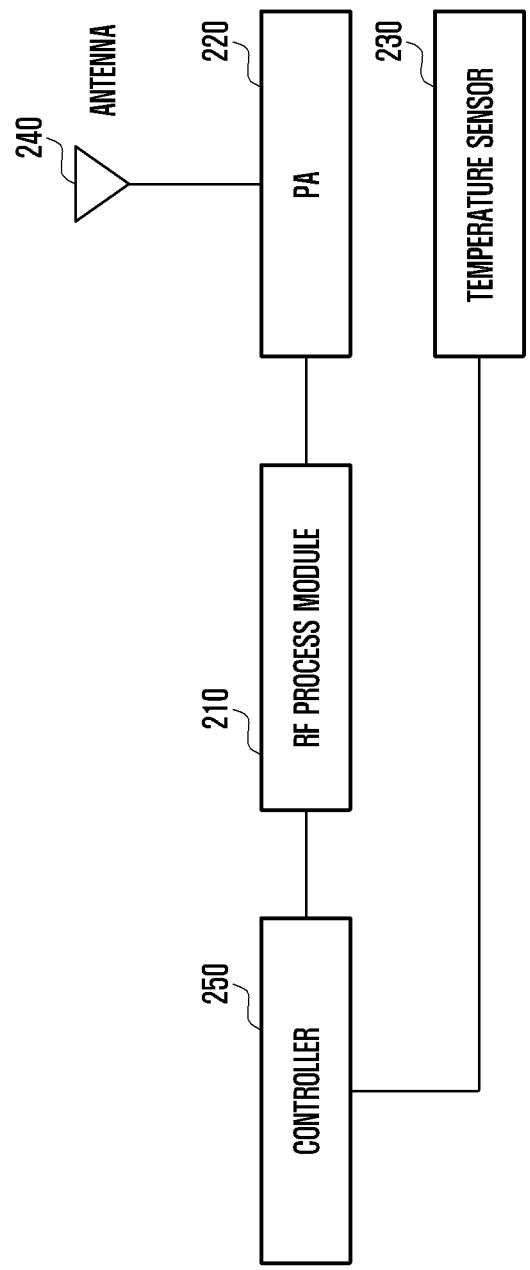
FIG. 2 illustrates a communication device according to an embodiment of the present invention.

FIG. 2 illustrates a communication device according to an embodiment of the present invention.

Referring to FIG. 2, the communication device includes an RF process module 210, a PA 220, a temperature sensor 230, an antenna 240, and a controller 250.

The RF process module 210 is capable of processing transmission/reception signals for communication with other communication devices. The RF process module 210 may modulate transmission signals for the PA 220 or demodulate signals received through the antenna 240 for the controller 250. For example, the RF process module 210 converts a baseband signal into an RF signal and transfers the RF signal to the PA 220 according to the controller 250.

The RF process module 210 may include a transmission-reception module (e.g., a transceiver). Alternatively, the RF process module 210 may include a transmission module (e.g., a transmitter) and a reception module (e.g., a receiver). Although not illustrated in FIG. 2, the RF process module 210 may include a low noise amplifier for processing RF signals, a mixer, a drive amplifier, a converter, etc.

The PA 220 amplifies signals from the RF process module 210 based on a bias voltage and transfers the amplified signals to the antenna 240. For example, the PA 220 includes an input terminal connected to the output terminal of the RF process module 210 and an output terminal connected to the antenna 240. When the PA 220 is implemented as a single component in the communication system, the controller 250 may apply a voltage corresponding to a bias value of the PA (hereafter referred to as a "PA bias value") to the PA 220, e.g., using power from a battery.

The PA 220 may also be implemented with a power amplifier module (PAM) including a digital to analog converter (DAC). For example, when the PA 220 is implemented with the PAM, the PAM may receive a PA bias value from the controller 250 and set the corresponding bias voltage for the PA 220 via the DAC, in order to control the voltage source of the PA 220, e.g., using power from the battery.

However, it should be understood that the configuration of the PA 220 is not limited to the above-described examples.

The temperature sensor 230 senses a surrounding temperature, e.g., by sensing a change in voltage that occurs due to the variation in resistance according to a temperature change. The temperature sensor 230 may transfer a signal indicating the sensed temperature change to the controller 250. The temperature sensor 230 may be a sensor for sensing a temperature change (e.g., a thermistor whose resistance is dependent on temperature). Also, the temperature sensor 230 may be located close to the PA 220, so that it can more accurately sense a change in the surrounding temperature of the PA 220.

The antenna 240 performs transmission and reception of signals via a communication network. The antenna 240 may include a duplexer for switching between transmitting and receiving.

The controller 250 may control the entire operation of the communication device and process data and signals transferred between the components thereof. For example, the controller 250 may control the supply of power from the battery to the components, and/or run various application programs stored in the program area of the storage unit, thereby performing corresponding functions, according to a user's settings. The controller 250 may include one or more application processors (APs) or one or more communication processors (CPs).

The controller 250 may adjust a bias value of the PA 220 based on commands stored in the program area of the storage unit (e.g., a memory). The controller 250 may monitor signals according to temperature changes sensed by the temperature sensor 230 based on commands stored in the program area of the storage unit; determine a PA bias value used for the PA 220 based on the monitored result; and control the PA 220 by using a signal corresponding to the PA bias value. For example, the controller 250 may determine a transmission level to transmit a transmission signal; select a PA bias value so that the PA 220 has a PA gain according to the transmission level; and control the PA 220 to amplify and output the transmission signal. The controller 250 may select a PA bias value according to a transmission level, in a first mode (e.g., high power mode) or in a second mode (e.g., low power mode).

For example, the first mode may be set in such a way that, since the PA 220 has a limit of an RF gain to process an RF signal, the controller 250 selects a relatively large PA bias value (e.g., a digital value for the PA 220 to output a signal of high power, such as 0xFF) and thus adjusts the PA gain to output transmission power according to a transmission level.

The second mode may be set in such a way that the controller 250 selects a relatively small PA bias value (e.g., a digital value enabling the PA 220 to output a signal of low power, such as 0x00) and thus reduces current consumption during a call.

The controller 250 may set a threshold value for distinguishing between the first and second modes. The threshold level may be set according to a communication standard or a system designer.

The controller 250 may determine a transmission level for transmitting signals to the outside.

For example, the controller 250 receives, from a communication network, information regarding a Power Control Level (PCL) determined by the communication network, and determines the communication level for signals to be transmitted through the antenna 240.

The controller 250 may also determine the transmission level in such a way that it receives a signal via the antenna 240 and measures the strength of the received signal, e.g., Received Signal Strength Indication (RSSI), etc.

The controller 250 may determine whether the determined transmission level is less than or equal to a threshold level. For example, when the controller 250 determines that the transmission level is less than or equal to a threshold level (e.g., corresponding to a second mode), the controller 250 selects a PA bias value based on a table used to compensate for a gain with a temperature change (or a temperature-based compensation table). When the controller 250 determines that the transmission level is greater than a threshold level (e.g., corresponding to a first mode), the controller 250 selects a PA bias value corresponding to the transmission level.

In accordance with an embodiment of the present invention, the communication device may store a table of biases corresponding to transmission levels (i.e., a bias table) and a temperature-based compensation table used to compensate a gain according to a temperature change.

Table 3 below is an example of a bias table. Specifically, Table 3 is an example of a bias table corresponding to a communication standard related to a specific communication band, e.g., GSM.

TABLE 3

|  | Transmission level (=PCL) | Antenna output | PA output | PA bias value (DAC) |
|---|---|---|---|---|
| 1st mode | 5 | 33 | 34 | 0xFF |
|  | 6 | 31 | 32 | 0xFF |
|  | 7 | 29 | 30 | 0xFF |
|  | 8 | 27 | 28 | 0xAA |
|  | 9 | 25 | 26 | 0x55 |
|  | 10 | 23 | 24 | 0x33 |
|  | 11 | 21 | 22 | 0x22 |
|  | 12 | 19 | 20 | 0x00 |
|  | 13 | 17 | 19 | 0x00 |

TABLE 3-continued

|  | Transmission level (=PCL) | Antenna output | PA output | PA bias value (DAC) |
|---|---|---|---|---|
| 2nd mode | 14 | 15 | 16 | 0x00 |
|  | 15 | 13 | 14 | 0x00 |
|  | 16 | 11 | 12 | 0x00 |
|  | 17 | 9 | 10 | 0x00 |
|  | 18 | 7 | 8 | 0x00 |
|  | 19 | 5 | 6 | 0x00 |

In Table 3, transmission levels 5 to 13 are in a range corresponding to the first mode (e.g., a high power mode) where the transmission level is greater than a threshold level; and transmission levels 14 to 19 are in a range corresponding to the second mode (e.g., a low power mode) where the transmission level is less than or equal to a threshold level. However, the present invention is not limited to the configuration of Table 3.

When the transmission level corresponds to the first mode, the controller 250 may select a PA bias value based on the bias table of Table 3. When the transmission level corresponds to the second mode, the controller 250 may select a PA bias value, referring to a temperature-based compensation table, e.g., as shown Table 4 below.

The temperature-based compensation table is configured to adjust (compensate for) a gain characteristic according to a temperature change. Table 4 is an example of a temperature-based compensation table according to an embodiment of the present invention, but the present invention is not limited thereto.

TABLE 4

| TA [° C.] | −30 | −10 | 10 | 30 | 50 | 85 |
|---|---|---|---|---|---|---|
| PA bias value (DAC) | 0x4E | 0x4C | 0x37 | 0x36 | 0x23 | 0x22 |
| Gain (dB) | 34.5 | 34.5 | 33 | 33.1 | 33.0 | 33.1 |

The temperature-based compensation table may be formed, based on data obtained from current consumption measurement and gains according to temperature changes and may be used for all transmission levels included in the second mode. Alternatively, a number of temperature-based compensation tables may be formed based on data obtained according to transmission levels included in the second mode.

When a transmission level is greater than a threshold level, the controller 250 may select a PA bias value corresponding to the transmission level, referring to a bias table, e.g., as shown in Table 3. For example, when a transmission level is level 10, the controller 250 may select a PA bias value corresponding to level 10, i.e., 0x33.

When a transmission level is less than or equal to a threshold level, the controller 250 checks a temperature via the temperature sensor 230 and then selects a PA bias value corresponding to the checked temperature, referring to the temperature-based compensation table.

The controller 250 may obtain a resistance according to a temperature change from the temperature sensor 230 and measuring a temperature corresponding to the obtained resistance. For example, when the controller 250 determines that a transmission level is level 15, which is less than or equal to a threshold level, it performs a control operation to measure a temperature. When the measured temperature is relatively low (e.g., −10° C.), the controller 250 selects a PA bias value mapped to −10° C., 0x4C, referring to a temperature-based compensation table.

The controller 250 may drive the PA 220 using a bias voltage corresponding to a PA bias value selected according to a transmission level, and control the PA 220 to amplify an input signal to a signal of significant power and to output the amplified signal. The controller 250 is also capable of broadcasting the amplified signal via the antenna 240.

When a transmission level corresponds to the first mode, the controller 250 selects a PA bias value corresponding to the transmission level (e.g., one fixed value set corresponding to one transmission level). When a transmission level corresponds to the second mode, the controller 250 selects a PA bias value corresponding to the transmission level according to a temperature change (e.g., a number of variable values according to temperature changes, corresponding to one transmission level).

The temperature-based compensation tables may be previously made. For example, a temperature-based compensation table may be formed in such a way as to meet a condition that a deviation of power gains between temperature intervals converges into a certain value (e.g., 1 dB).

The temperature-based compensation table may also be formed in such a way as to meet a condition that a PA bias value is as small as possible as, or reaches a lowest possible value (e.g., a DAC value, a setup value, a digital value, etc.), satisfying the condition that the deviation of power gains between temperature intervals converges into a certain value.

The temperature-based compensation table may be formed in such a way as to meet a condition that the deviation of gains according to differences between parts for a PA 220 converges into a certain value (e.g., 1 dB). For example, because devices in communication systems are manufactured and then experience a calibration (e.g., an RF calibration) to adjust (compensate) the transmission power in a room temperature environment, the condition that the deviation of power gains between temperature intervals is less than a certain value (e.g., 1 dB) may refer to a condition as to whether a deviation of gain characteristics of a high temperature or low temperature with respect to a room temperature can be adjusted. When the digital value increases, the gain of the PA 220 and the current consumption of the PA 220 also increase. Therefore, the condition that a PA bias value is as small as possible, or reaches a lowest possible value (e.g., less than a certain value) may refer to a condition that the gain of the RF process module is compensated by an amount that the gain of the PA is reduced, thereby reducing current consumption.

When the deviation of gains between types of PAs in individual temperature intervals is relatively large, which causes communication devices to differ in performance from each other, the condition that the deviation of gains according to differences between parts for a PA is within a certain value (e.g., 1 dB) may refer to a condition that a PA bias value is adjusted to reduce the deviation of gains between types of PAs.

Communication devices may previously form a temperature-based compensation table satisfying the conditions described above, in order to subdivide a temperature into subdivided temperatures, and determine a PA bias value, based on an extent that the gain of a PA is lowered in individual temperature conditions. As a result, the PA 220 can amplify an input signal into a signal with a certain gain, regardless of temperature changes.

Figure 3:
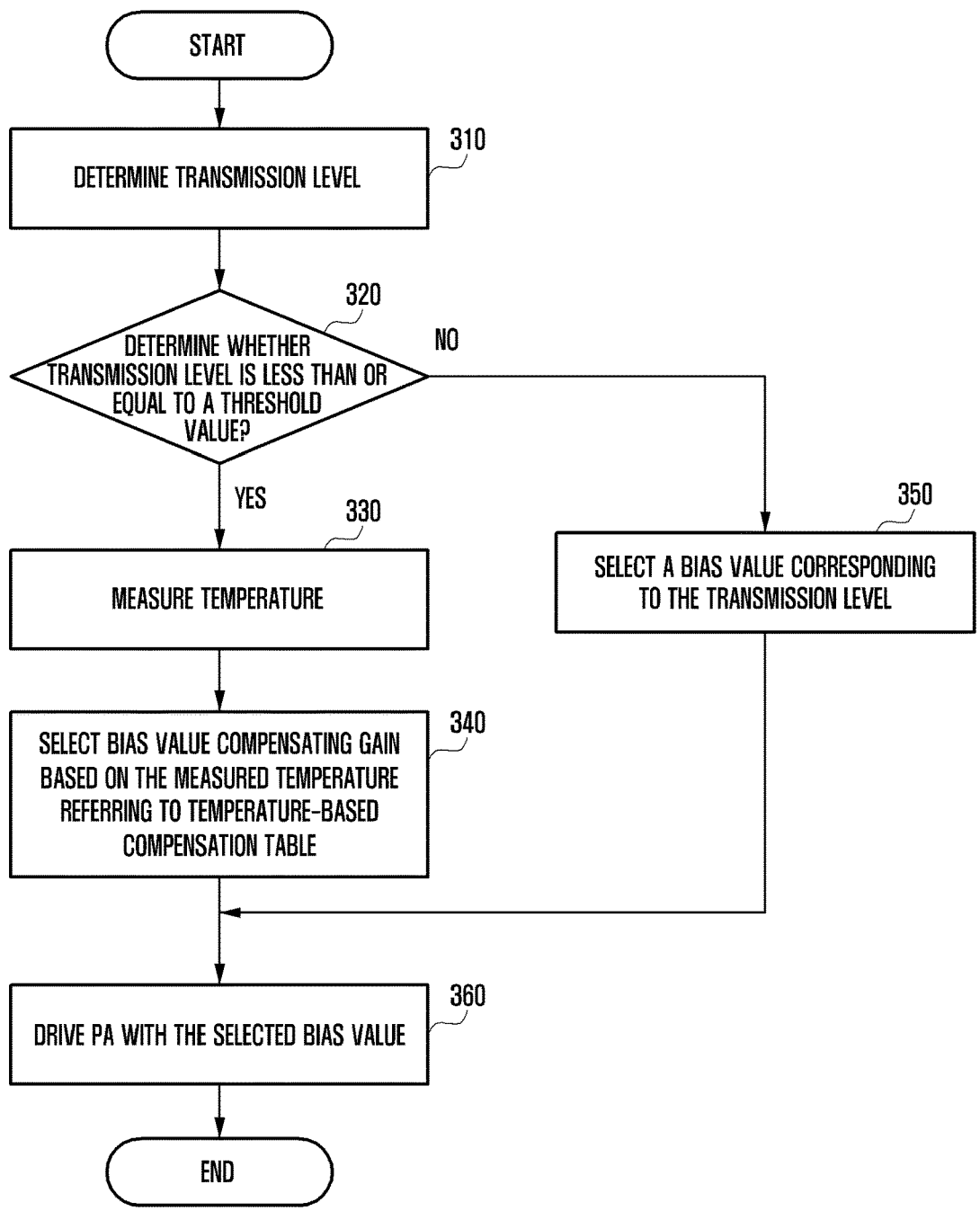
FIG. 3 is a flow chart illustrating a transmission power control method according to an embodiment of the present invention.

FIG. 3 is a flow chart illustrating a transmission power control method according to an embodiment of the present invention.

Referring to FIG. 3, in step 310, a controller of an electronic device (e.g., the controller 250 illustrated in FIG. 2) determines a transmission level used for transmitting signals. For example, the controller may receive information regarding a transmission level (e.g., a power control level) according to a communication state from a communication network (e.g., a base station of the communication network), or determine a transmission level by measuring the strength of a signal received from the base station.

In step 320, the controller determines whether the determined transmission level is less than or equal to a threshold level. The threshold level may be a preset level to distinguish between a high power mode and a low power mode. For example, a GSM900 communication network may be set in such a way that transmission levels 5 to 13 correspond to a high power mode and transmission levels 14 to 19 correspond to a low power mode.

When the transmission level is less than or equal to a threshold level in step 320, the controller detects a surrounding temperature in step 330. For example, the controller detects a voltage that varies as the resistance of a temperature sensor (e.g., a thermistor).

In step 340, the controller selects a PA bias value based on the measured temperature. For example, the controller selects a PA bias value corresponding to the measured temperature, referring to a temperature-based compensation table as shown in Table 4. Since the temperature-based compensation table was described above referring to FIG. 2, its detailed description is omitted hereinafter.

However, when the transmission level is greater than a threshold level in step 320, the controller selects a PA bias value corresponding to the transmission level in step 350. For example, the controller selects a PA bias value corresponding to the transmission level, referring to a bias table as shown in Table 3.

In step 360, the controller drives the PA with the selected PA bias value. For example, the PA receives a bias voltage corresponding to the selected PA bias value, amplifies an input signal to a signal of power based on the received voltage, and transfers the amplified signal to the antenna, under the control of the controller.

Figure 4:
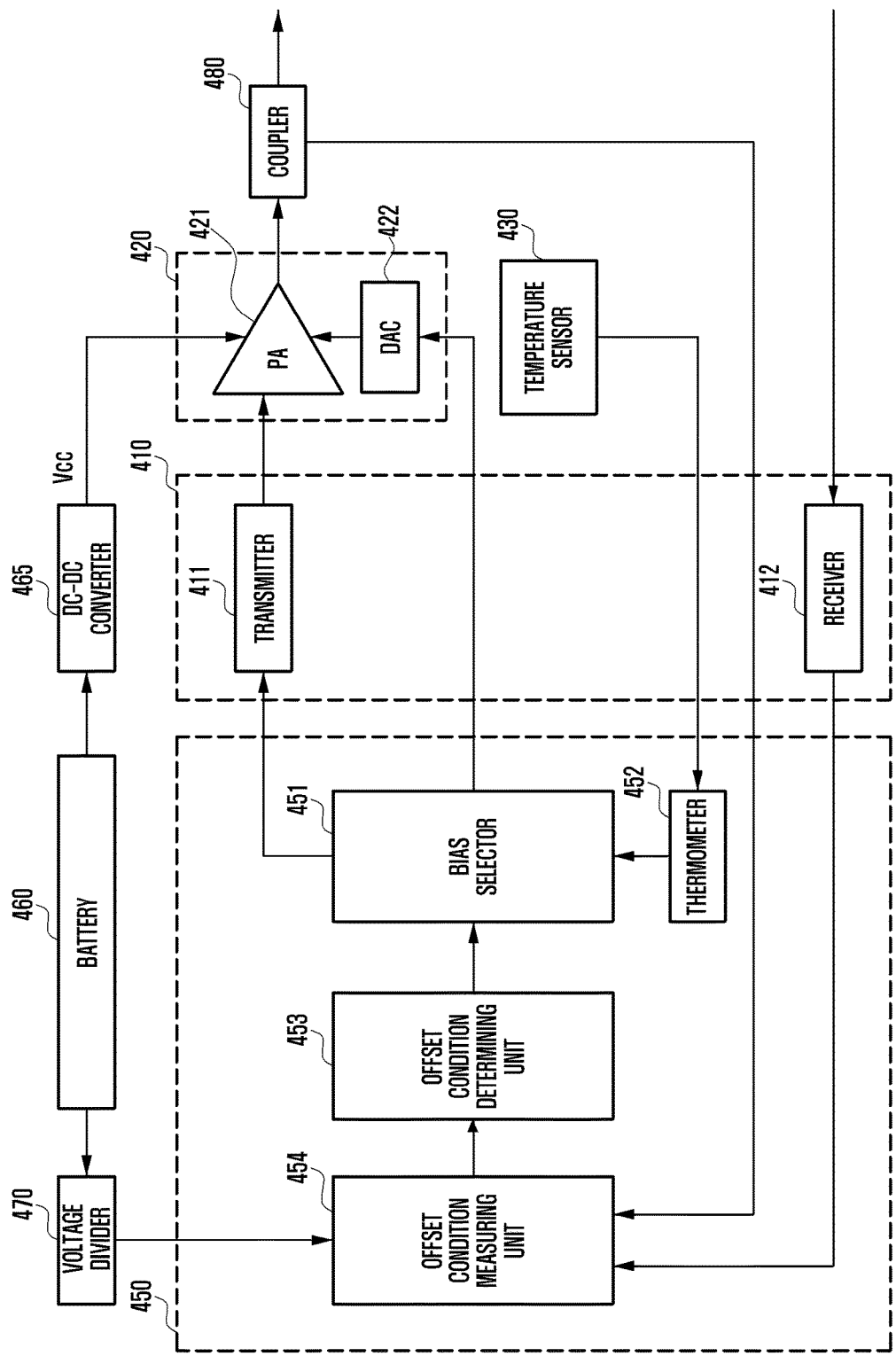
FIG. 4 illustrates an electronic device according to an embodiment of the present invention.

FIG. 4 illustrates an electronic device according to an embodiment of the present invention.

Referring to FIG. 4, the electronic device includes an RF process module 410, a PAM 420, a temperature sensor 430, a controller 450, a battery 460, a DC-DC converter 465, a voltage divider 470, and a coupler 480.

The RF process module 410 processes transmission and reception signals for communication with other devices. The RF process module 410 modulates transmission signals for the PAM 420 or demodulates signals received from the outside and transfers the demodulated signals to the controller 450.

The RF process module 410 includes a transmitter 411 for transmitting signals and a receiver 412 for receiving signals. Alternatively, the RF process module 410 is capable of including a transceiver for transmitting and receiving signals. The RF process module 410 may also include a low noise amplifier, a mixer, a drive amplifier, a converter, etc.

The PAM 420 is connected to the coupler 480 and the transmitter 411 of the RF process module 410. The PAM 420 amplifies a signal transferred from the RF process module 410 to a signal of significant power by using the bias voltage, and transfers the amplified signal to the coupler 480.

The PAM 420 includes a PA 421 and a DAC 422. The PA 421 amplifies a modulated signal, transferred from the transmitter 411, to a signal of significant power by using the bias voltage, and outputs the amplified signal. For example, the PA 421 may be implemented with a GSM PA configured to amplify RF signals modulated according to the GSM standard.

When the DAC 422 receives a PA bias value under the control of the controller 450, it drives the PA 421 by supplying a voltage corresponding to the PA bias value thereto, so that the PA 421 has a gain corresponding to the PA bias value.

The electronic device may also include a Voltage Controller (VC), connected to the battery and the PAM, and/or a Power Management IC (PMIC). In this case, the communication system may control the voltage supplied to the PA by the VC and/or the PMIC.

The temperature sensor 430 senses a surrounding temperature. The temperature sensor 430 transfers a signal of the sensed temperature change to the controller 450. The temperature sensor 430 may be a sensor for sensing a temperature change (e.g., a thermistor whose resistance is dependent on temperature). The temperature sensor 430 may be located close to the PAM 420, in order to more accurately sense the surrounding temperature of the PAM 420.

The battery 460 stores energy and supplies the stored energy to the components in the electronic device.

The DC-DC converter 465 adjusts a driving voltage and supplies the adjusted driving voltage to the PA 421. The DC-DC converter 465 may supply a voltage corresponding to a bias value to the PA 421.

The voltage divider 470 performs voltage division by using the current from the battery 460.

The coupler 480 connects the PA 421 and the antenna, and distributes the amplified signal output from the PA 421 to a specific signal of power or extracts a specific signal of power from the amplified signal.

The controller 450 may control the entire operation of the electronic device and process data and signals flowing between the components thereof. The controller 450 may control the supply of power from the battery 460 to the components.

The controller 450 may run various application programs stored in the program area of a storage unit, thereby performing corresponding functions, according to user settings. The controller 450 may include one or more APs or CPs.

The controller 450 may monitor signals according to temperature changes sensed by the temperature sensor 430 based on commands stored in the program area of the storage unit, determine a PA bias value used for the PA 421 based on the monitored result, and control the PA 421 by using a signal corresponding to the PA bias value.

In order to transmit a transmission signal, the controller 450 may determine a transmission level, select a PA bias value for the PA 421 so that the PA 421 has a PA gain corresponding to the transmission level, and control the PA 421 to amplify the transmission signal to a signal of significant power.

The controller 450 includes a bias selector 451, a thermometer 452, an offset condition determining unit 453, and an offset condition measuring unit 454.

The bias selector 451 is capable of determining whether a transmission level is less than or equal to a threshold level.

When the transmission level corresponds to the first mode, the bias selector 451 selects a PA bias value based on a bias table, e.g., as described above in Table 3. When the transmission level corresponds to the second mode, the bias selector 451 selects a PA bias value, referring to a temperature-based compensation table, e.g., as described above in Table 4.

In the first mode, where a transmission level is greater than a threshold level, the bias selector 451 selects a PA bias value set as a single value corresponding to the transmission level and transfers the selected PA bias value to the PAM 420.

In the second mode, where a transmission level is less than or equal to the threshold level, the bias selector 451 receives a measured temperature from the thermometer 452. The thermometer 452 senses a change in voltage level that occurs due to the variation in resistance according to a temperature change from the temperature sensor 430, measures a temperature according to the voltage change, and transfers the measured temperature to the bias selector 451.

The bias selector 451 selects a PA bias value, based on the measured temperature transferred from the thermometer 452, referring to a temperature-based compensation table, and transfers the selected PA bias value to the PAM 420.

The bias selector 451 may vary a PA bias value according to an offset adjusting value transferred via the offset condition determining unit 453 and transfers the varied PA bias value to the PAM 420.

The offset condition measuring unit 454 measures at least one of a battery level, a received signal level, a DC-DC level, a transmission feedback level, and a PA load level, and transfers the measured offset condition to the offset condition determining unit 453.

The offset condition measuring unit 454 measures a battery level based on a voltage that is transferred to the controller 450 from the battery 460 through the voltage divider 470.

When the RF process module 410 amplifies a signal received via the antenna to a signal of power, demodulates the signal and transfers the demodulated signal to the controller 450, the offset condition measuring unit 454 measures a received signal level based on the processed signal that is transferred to the controller 450.

The offset condition measuring unit 454 checks a voltage supplied to the PA 421 according to a transmission level, and measures the DC-DC level based on the checked voltage.

The offset condition measuring unit 454 measures a transmission feedback level based on output power coupled with the coupler 480. For example, when an antenna matching feature varies, the transmission power may also vary.

The offset condition measuring unit 454 measures power coupled in a particular direction via the coupler 480 in order to measure a change in feedback power. A change in feedback power may be used to determine whether a change in the antenna matching feature varies.

The offset condition measuring unit 454 measures a PA load level by being coupled with reflected power of the output power or a change in the feedback power, output from the coupler 480. For example, the offset condition measuring unit 454 measures feedback power by being coupled with forward power and also reflected power of transmission power by coupling the reflected power with the reverse power.

The offset condition determining unit 453 determines a condition value to vary a PA bias value according to an offset condition level transferred from the offset condition measuring unit 454 and adjusts (increases or decreases) the PA bias value based on the determined condition value. The offset condition determining unit 453 may select a PA bias value to vary the PA bias value according to an offset condition level, e.g., referring to an offset condition table.

The offset condition determining unit 453 may vary a PA bias value by employing at least one of a battery level, a received signal level, a DC-DC level, a transmission feedback level, and a PA load level. A method of varying a PA bias value according to an offset condition level will be described in more below referring to FIG. 6.

Figure 5:
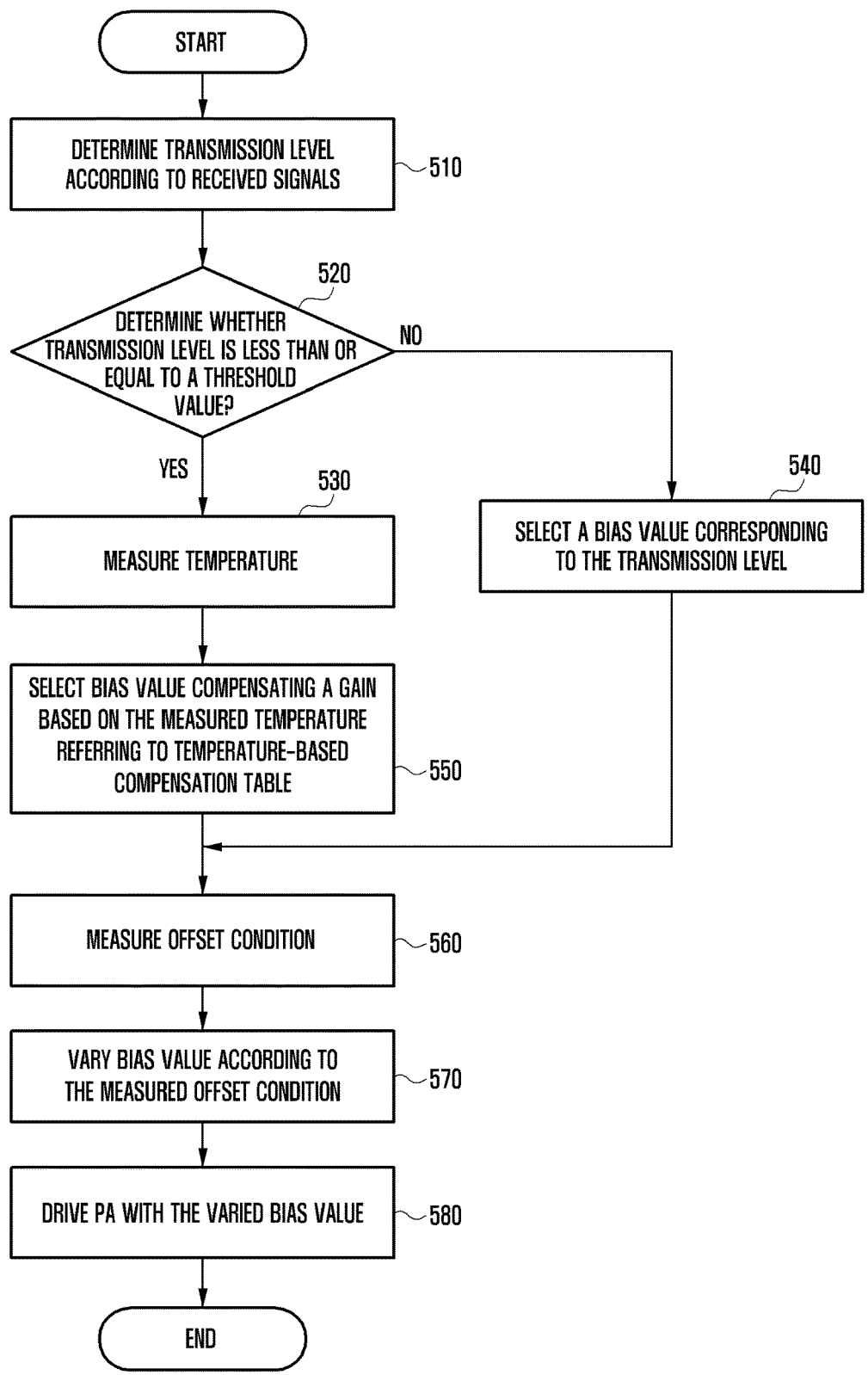
FIG. 5 is a flow chart illustrating a transmission power control method according to an embodiment of the present invention.

FIG. 5 is a flow chart illustrating a transmission power control method according to an embodiment of the present invention.

Referring to FIG. 5, in step 510, a controller of an electronic device (e.g., the controller 450 illustrated in FIG. 4) determines a transmission level for transmitting signals. For example, the controller receives information regarding a transmission level (e.g., a power control level) according to a communication state from a communication network (e.g., a base station of the communication network), or determines a transmission level by measuring the strength of a signal received from the base station.

In step 520, the controller determines whether the determined transmission level is less than or equal to a threshold level. The threshold level may be a preset level to distinguish between a high power mode and a low power mode.

When the controller determines that the transmission level is less than or equal to a threshold level in step 520, the controller measures the temperature in step 530. For example, the controller detects a voltage level that varies as the resistance of the temperature sensor (e.g., a thermistor) according to a temperature change, and determines the surrounding temperature based on the voltage level.

The controller selects a PA bias value based on the measured temperature in step 550. For example, the controller selects a PA bias value corresponding to the measured temperature, referring to a temperature-based compensation table, e.g. as shown in Table 4.

In step 560, the controller measures an offset condition according to operation conditions and states of the electronic device. For example, in order to check operation conditions and states of the electronic device, the controller may measure or receive at least one of a battery level, a received signal level, a DC-DC level, a transmission feedback level, and a PA load level.

In step 570, the controller varies a PA bias value based on the offset condition. For example, the controller adjusts the PA bias value to the adjusted value determined by the measured offset condition, an increase or a decrease, or may select a PA bias value referring to an offset condition table.

The controller may vary a PA bias value by employing at least one of a battery status, a received signal status, a DC-DC value, transmission feedback power, and PA load. Because the offset condition may vary according to operation conditions and states of the electronic device, the transmission power control may be designed by employing on or more offset conditions according to a system designer's intention.

Examples of the method of varying a PA bias value according to offset conditions are described as follows.

1) Battery Level

The controller is capable of measuring a battery level and varying a PA bias value according to the measured battery level. For example, the controller may determine an offset adjusting value according to a battery level and adjusting and varying a PA bias value based on the determined offset adjusting value.

The controller may vary a PA bias value mapped to the measured battery level, referring to a battery offset table. For example, as shown in Table 5 below, the battery offset table may be formed in such a way that measured battery levels are classified in a difference of 0.2 V, and hexadecimal numbers are increased or decreased by two between temperature ranges.

TABLE 5

| Battery level [Volt] | PA temperature [° C.] | | | | | |
|---|---|---|---|---|---|---|
| | −30 | −10 | 10 | 30 | 50 | 85 |
| 4.4 | 0x4E | 0x4C | 0x37 | 0x36 | 0x23 | 0x22 |
| 4.2 | | | | | | |
| 4.0 | | | | | | |
| 3.8 | 0x4C | 0x4A | 0x35 | 0x34 | 0x21 | 0x20 |
| 3.6 | 0x4A | 0x48 | 0x37 | 0x32 | 0x00 | 0x00 |

For example, when a PA bias value is 0xFF, the third digit code "F" may be set as a bias value of a Driver Stage and the fourth digit code of "F" may be set as a PA bias value of a Final Stage in the battery offset table. The battery offset table is formed in such a way that bias values of the Final Stage are decreased by two in code between temperature ranges. When the fourth digit code is "0" and the bias values cannot be further decreased, the third digit code values start to be decreased by two in code between temperature ranges.

For example, when a transmission level is level 15, which corresponds to a low power mode, the controller performs a control operation to measure a temperature. When the measured temperature is −10° C., the controller selects a PA bias value as "0x4C" referring to a temperature-based compensation table, e.g., as shown in Table 4. When the controller measures a battery level, a relatively low voltage of 3.8 V, the PA bias value is altered to a PA bias value of "0x4A" corresponding to the condition of −10° C.

As described above, the controller of the electronic device is capable of varying a PA bias value according to battery states, thereby reducing a level of voltage supplied to the PA to perform an amplification function and thus extending the battery use time.

2) Received Signal Level

The controller may measure a level of signal received by a receiver and vary a PA bias value according to the measured received signal level. The controller may measure a received signal level by using at least one of a received signal strength indicator (RSSI), a received signal code power (RSCP), a reference signal received power (RSRP), and an Energy per chip to Interference power ratio (Ec/Io). For example, when a received signal level is in a weak electric field state, the electronic device uses a relatively high transmission power, and adjusts the PA bias value to increase the transmission power, instead of increasing the RF process gain or the transmission level. The controller may measure a received signal level, determine an offset adjusting value according to the received signal level, and vary the PA bias value with the determined adjusting value (or vary a PA bias value to a value mapped to a level that is measured, based on a received signal offset table).

When received signal levels correspond to a level of weak electric field and a level of very weak electric field, the received signal offset table may be created from a temperature-based compensation table in such a way that PA bias values increase according to temperature changes, as shown in Table 6 below.

TABLE 6

| RSSI [dBm] | PA temperature [° C.] | | | | | |
|---|---|---|---|---|---|---|
| | −30 | −10 | 10 | 30 | 50 | 85 |
| −70 | 0x4E | 0x4C | 0x37 | 0x36 | 0x23 | 0x22 |
| −80 | | | | | | |
| −90 | | | | | | |
| −100 | 0x6E | 0x4E | 0x39 | 0x38 | 0x25 | 0x24 |
| −110 | 0xAE | 0x8F | 0x3D | 0x3C | 0x29 | 0x28 |

For example, the received signal offset table may be set in such a way that RSSI of −100 corresponds to a weak electric field state and the fourth digit code of the PA bias value increases by two in code, and RSSI of −110 corresponds to a very weak electric field state and the fourth digit code of the PA bias value further increases by four in code.

When the fourth digit code is "F" and cannot be further increased, the received signal offset table may be set in such a way that the third digit codes are increased by two or four in code.

As describe above, when the electronic device measures a received signal level and determines that the measured, received signal level corresponds to a weak electric field state or a very weak electric field state, the controller may increase the PA bias value to adjust the PA gain because the received signal strength is weak, thereby outputting a signal of relatively high power.

3) DC-DC Level

The controller may adjust a PA bias value to an offset adjusting value determined according to a received DC-DC level and a transmission level, or may vary a PA bias value based on a DC-DC level and transmission level offset table.

Table 7 is an offset table for maintaining linearity by varying Vcc that the DC-DC converter supplies to a PA. When the PA bias value is fixed, the controller may increase Vcc in order to maintain the linearity of operation of the PA as the output power increases.

TABLE 7

| Output power | Vcc [V] | DAC |
| --- | --- | --- |
| 18 dBm | 2.4 | 0x4E |
| 16 dBm | 2.3 | |
| 14 dBm | 2.2 | |

Table 8 is an offset table for maintaining linearity by adjusting a PA bias value. When the PA should increase the output power, the controller may maintain the linearity of operation of the PA by increasing the PA bias value without varying the Vcc.

TABLE 8

| Output power | Vcc [V] | DAC |
| --- | --- | --- |
| 18 dBm | 2.2 | 0x8F |
| 16 dBm | | 0x6F |
| 14 dBm | | 0x4E |

As described above, the electronic device is capable of adjusting or increasing a bias value, instead of increasing Vcc, in order to increase the PA Linearity.

4) Transmission Feedback Level

The controller may measure feedback power output from the PA, adjust a PA bias value to an offset adjusted value determined according to the measured feedback power, or varying a PA bias value based on a feedback power offset table.

The feedback power offset table may be formed in such a way that a difference between power output from the PA and a set transmission power is obtained, and a PA bias value is varied between temperature ranges from a temperature-based compensation table, e.g., as shown in Table 9 below.

TABLE 9

| | PA temperature [° C.] | | | | | |
| --- | --- | --- | --- | --- | --- | --- |
| Tx FB power [dB] | −30 | −10 | 10 | 30 | 50 | 85 |
| 3.0 | 0xCF | 0xCF | 0x3F | 0x3E | 0x2B | 0x2A |
| 2.0 | 0x8F | 0x8F | 0x3B | 0x3A | 0x27 | 0x26 |
| 1.0 | 0x4E | 0x4C | 0x37 | 0x36 | 0x23 | 0x22 |
| 0.0 | | | | | | |

The controller may determine a transmission feedback level based on a difference between transmission power corresponding to a bias value and amplified power (i.e., a feedback power) output from the PA.

The feedback power offset table may be set in such a way that: transmission feedback levels are divided by a unit of 1 dB, offset values corresponding to transmission power levels less than 1 dB are set to "zero", offset values corresponding to a transmission power level of 2 dB increase by four in code, and offset values corresponding to transmission power levels greater than or equal to 3 dB increase by four in code. The DC-DC level offset table may also be set in such a way that, when the fourth digit code is "F" and cannot be further increased, the third digit codes are increased by four in code.

5) PA Load

The controller may measure feedback power output from the PA, and adjust the PA bias value with an offset adjusting value determined based on the measured feedback power, or vary a PA bias value based on a PA load offset table.

The PA load offset table may be formed in such a way as to distinguish between power output from the PA and a set transmission power, and to vary a PA bias value according to temperature changes in a temperature-based compensation table, e.g., as shown in Table 10 below.

TABLE 10

| | PA temperature [° C.] | | | | | |
| --- | --- | --- | --- | --- | --- | --- |
| PA load [dB] | −30 | −10 | 10 | 30 | 50 | 85 |
| 3.0 | 0xCF | 0xCF | 0x3F | 0x3E | 0x2B | 0x2A |
| 2.0 | 0x8F | 0x8F | 0x3B | 0x3A | 0x27 | 0x26 |
| 1.0 | 0x4E | 0x4C | 0x37 | 0x36 | 0x23 | 0x22 |
| 0.0 | | | | | | |

The controller may determine a transmission feedback level based on a difference between transmission power corresponding to a bias value and power output from the PA (i.e., a feedback power or a reflected power).

The PA load offset table may be set in such a way that PA load levels are divided by a unit of 1 dB, bias values corresponding to PA load levels less than 1 dB are set to "zero", bias values corresponding to a transmission power level of 2 dB increase by four in code between temperature changes, and bias values corresponding to transmission power levels greater than or equal to 3 dB increase by four in code.

The PA load offset table may also be set in such a way that, when the fourth digit code is "F" and cannot be further increased, the third digit codes are increased by four in code.

For example, the PA load of the communication system may vary according to the use states or conditions.

Figure 7:
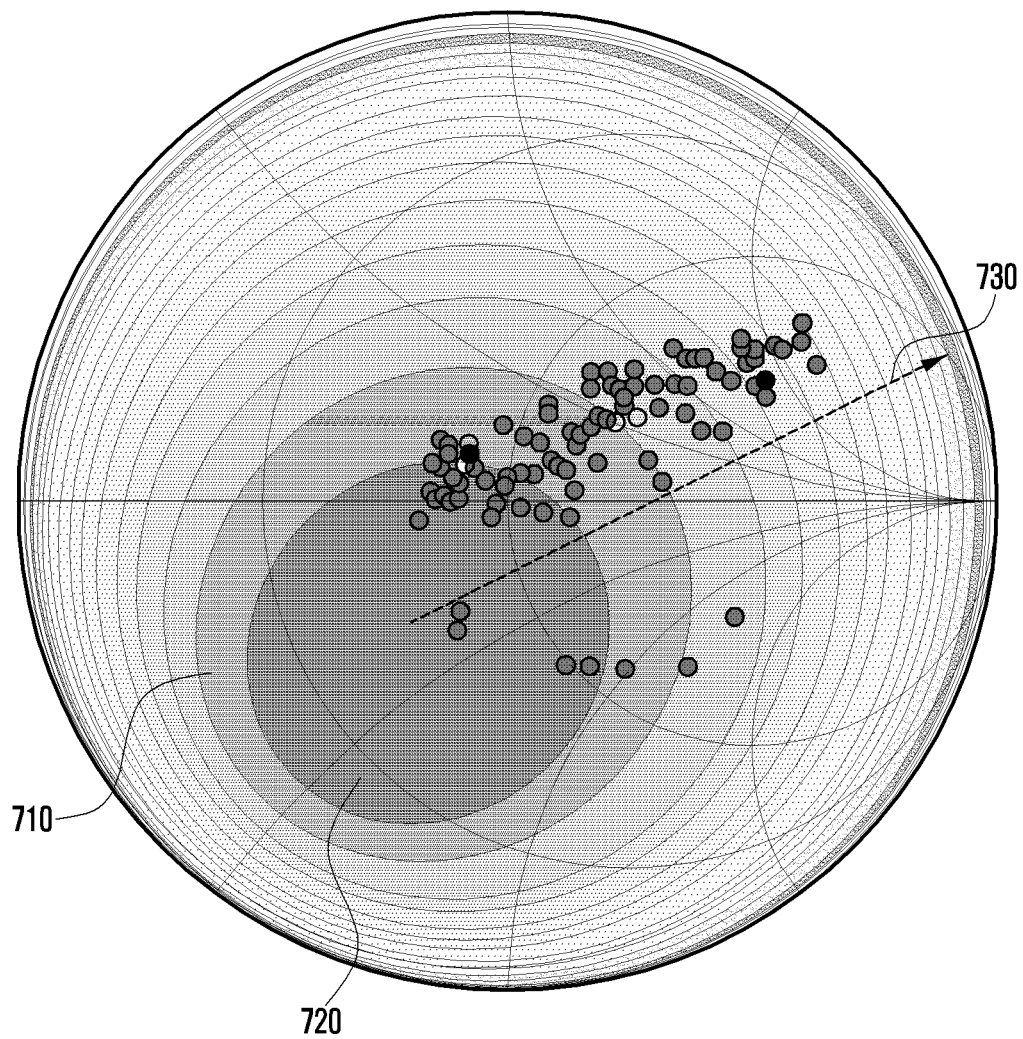
FIG. 7 is a diagram illustrating in PA load characteristic changes of an electronic device based on use states of the electronic device.

FIG. 7 is a diagram illustrating in PA load characteristic changes of an electronic device based on use states of the electronic device.

Referring to FIG. 7, reference number 710 refers to PA power contour lines and reference number 720 refers to an output range of signals at the maximum power. When the electronic device is held by the user or contacts the user's body, the antenna characteristic varies, which causes the load characteristic connected to the output of the PA to vary.

The dots in FIG. 7 represent changes in PA load levels altered while the user uses the electronic device. The PA load has characteristics where amplified output power is gradually decreased as the PA load varies in the arrow direction 730.

As described above, the electronic device compensates the reduction of transmission power according to the user states with PA load characteristics, thereby adjusting the PA gain.

Referring again to FIG. 5, the controller drives the PA with the selected PA bias value in step 580. For example, the PA receives a bias voltage corresponding to the selected PA bias value, amplifies an input signal to a signal of power based on the received voltage, and transfers the amplified signal to the antenna, under the control of the controller.

However, when the transmission level is greater than a threshold level in step 520, the controller selects a PA bias value corresponding to the transmission level in step 540.

Figure 6:
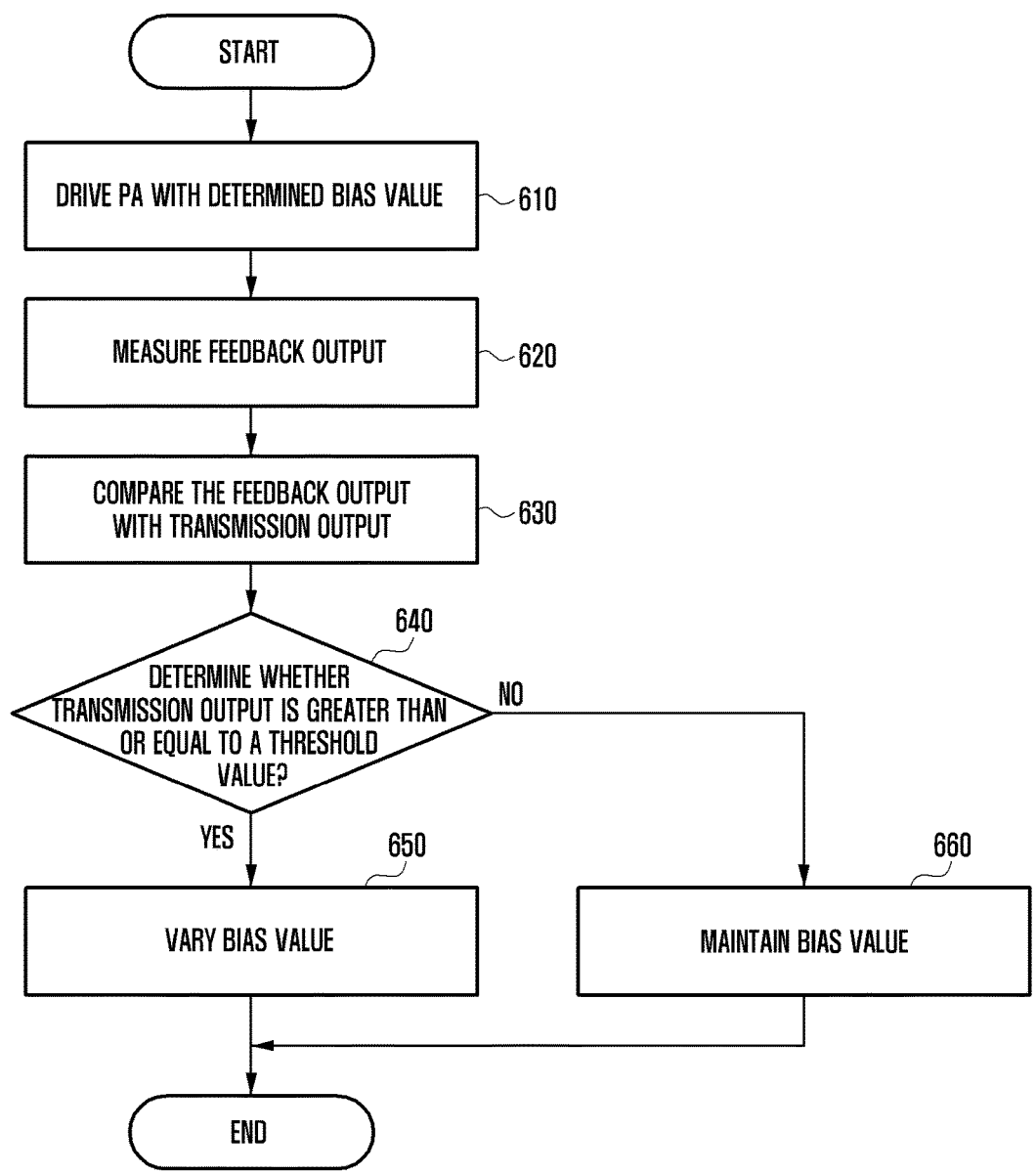
FIG. 6 is a flow chart illustrating a transmission power control method according to an embodiment of the present invention.

FIG. 6 is a flow chart illustrating a transmission power control method according to an embodiment of the present invention.

Referring to FIG. 6, the controller drives a PA with a PA bias value in step 610. For example, the controller is capable of selecting or varying the PA bias value by performing the processes described above with reference to FIG. 4 or 5 and controlling the PA to amplify signals by using the PA bias value. For example, when a transmission level is greater than a threshold level, the controller may control the PA by using a PA bias value corresponding to the transmission level, within a standard range, and when a transmission level is less than or equal to a threshold level, the controller may control the PA by using a PA bias value that varies based on a temperature and offset conditions.

In step 620, the controller measures the power output from the output terminal of the PA.

When a coupler, connected to the output terminal of the PA, transfers signals coupled with the PA to the controller, the controller measures the PA output power based on the signal from the coupler. For example, when a ratio of impedance matching to a characteristic impedance of an antenna (e.g., a voltage standing wave ratio) increases, the transmission output power coupled with the coupler may increase or decrease.

In step 630, the controller compares the coupled transmission output power with the transmission power (e.g., an ideal transmission power corresponding to a PA bias value), and in step 640, determines whether the comparison result is greater than or equal to a threshold (or a preset condition). When the controller determines that the comparison result is greater than or equal to a threshold in step 640, the controller varies the determined PA bias value in step 650. However, when the controller determines that the comparison result is less than a threshold in step 640, the controller maintains the current PA bias value in step 660.

As described above, in accordance with an embodiment of the present invention, an electronic device is capable of varying a PA bias value according to a temperature condition to drive a PA by using the varied PA bias value, such that the PA has a constant PA gain, regardless of temperature changes.

Table 11 below provides an example of measurement results of PA current consumption and PA gain characteristics, at individual temperatures, based on a temperature-based compensation table according to an embodiment of the present invention.

TABLE 11

| TA [° C.] | −30 | −10 | 10 | 30 | 50 | 85 |
|---|---|---|---|---|---|---|
| PA bias value (DAC) | 0x4E | 0x4C | 0x37 | 0x36 | 0x23 | 0x22 |
| Gain (dB) | 34.5 | 34.5 | 33 | 33.1 | 33.0 | 33.1 |

Referring to Table 11, signals are amplified with a constant PA gain, regardless of temperature changes, e.g., low temperature, room temperature, and high temperature. Therefore, the PA according to the present invention amplifies signals with a constant PA gain of approximately 33 dB, regardless of temperature changes. In particular, the PA amplifies power in a low temperature environment, e.g., −30° C. and −10° C., with a PA gain of approximately 1.5 dB greater than in the room temperature.

In addition, the PA again is increased to prevent the transmission power from decreasing in a low temperature environment and avoiding current consumption during a call in a room temperature environment. For example, when the PA has PA gains as fixed PA bias values corresponding to transmission levels in low and high temperature environments, the current consumption during a call is measured as 190.0 mA in a room temperature environment. However, when a PA bias value is adjusted at a room temperature according to an embodiment of the present invention, the current consumption during a call is measured as 125.0 mA, which is improved 70 mA compared to using the fixed PA bias values.

According to an embodiment of the present invention, in order to secure a constant PA gain in a low temperature environment (e.g., −30° C. and −10° C.), the current consumption of the PA increases compared with the room temperature environment.

Power output from an RF process module may vary according to the locations of a PA in the communication system. The transmission power may vary according to communication system characteristics and types of PA. Therefore, as shown in Table 11, the PA gain is adjusted to be 33 dB to 34 dB at temperature conditions in temperature intervals of −30° C. and −10° C., thereby amplifying a signal to meet the RF signal standard.

When a PA is driven with a PA bias value that is adjusted by compensating a temperature change in a low temperature mode according to an embodiment of the present invention, Table 12 provides an example of measurement results of transmission powers output from the PA.

TABLE 12

| Mode | Test Item | Min | Max | Unit | +50° C. | +35° C. | −20° C. |
|---|---|---|---|---|---|---|---|
| 1st mode | TX Power @ Lvl 5 | 31 | 35 | dBm | 32.59 | 32.57 | 32.08 |
| | TX Power @ Lvl 6 | 28 | 34 | dBm | 31.28 | 31.24 | 30.52 |
| | TX Power @ Lvl 7 | 27 | 31 | dBm | 29.44 | 29.36 | 28.41 |
| | TX Power @ Lvl 8 | 24 | 30 | dBm | 27.62 | 27.23 | 26.40 |
| | TX Power @ Lvl 9 | 22 | 28 | dBm | 25.75 | 25.37 | 24.30 |
| | TX Power @ Lvl 10 | 20 | 26 | dBm | 23.83 | 22.59 | 21.75 |
| | TX Power @ Lvl 11 | 18 | 24 | dBm | 21.72 | 20.92 | 20.15 |
| | TX Power @ Lvl 12 | 16 | 22 | dBm | 19.86 | 18.81 | 17.96 |
| | TX Power @ Lvl 13 | 14 | 20 | dBm | 17.94 | 16.78 | 15.85 |

TABLE 12-continued

| Mode | Test Item | Min | Max | Unit | +50° C. | +35° C. | −20° C. |
|---|---|---|---|---|---|---|---|
| 2$^{nd}$ mode | TX Power @ Lvl 14 | 12 | 18 | dBm | 16.31 | 14.74 | 13.79 |
| | TX Power @ Lvl 15 | 10 | 16 | dBm | 14.37 | 12.69 | 11.66 |
| | TX Power @ Lvl 16 | 6 | 16 | dBm | 12.40 | 10.82 | 9.93 |
| | TX Power @ Lvl 17 | 4 | 14 | dBm | 10.69 | 8.84 | 7.94 |
| | TX Power @ Lvl 18 | 2 | 12 | dBm | 8.32 | 6.86 | 5.86 |
| | TX Power @ Lvl 19 | 0 | 10 | dBm | 6.39 | 4.76 | 3.90 |

As shown in Table 12, in a second mode (e.g., a low power mode), the PA outputs transmission power according to the GSM standard in a low temperature environment. When a transmission level corresponds to a low power mode, in order to compensate for a lowered PA characteristic due to a low temperature environment, the electronic device can adjust a PA bias value of the PA so that the PA has a constant PA gain, regardless of temperature changes, and thus, can prevent the transmission power from decreasing.

As described above, various embodiments of the present invention are capable of varying or adjusting a bias value of a PA based on changes in temperature, for a low-power transmission level, which improves an amplification gain in a low temperature environment to amplify power regardless of temperature changes and simultaneously, reduces the current consumption during a call in a room temperature environment.

In addition, various embodiments of the present invention are capable of measuring an offset condition, such as a battery status of an electronic device, a receiving status of an antenna, transmission feedback power, a voltage applied to a PA, etc., and applying the offset condition to the PA bias value, in order to optimize a battery use time and enhance the transmission power according to reception states.

An electronic device and a power transmission method according to the above-described embodiments of the present invention may be implemented with program commands that can be conducted via various types of computers and recorded in computer-readable recording media. The computer-readable recording media contain program commands, data files, data structures, etc., or a combination thereof. The program commands recorded in the recording media may be designed or configured to comply with the present invention or may be software well-known to the ordinary person skilled in the art.

Examples of computer-readable media may include magnetic media, such as hard disks, floppy disks, and magnetic tape; optical media such as Compact Disc Read Only Memory (CD-ROM) disks and DVDs; magneto-optical media, such as floptical disks; and hardware devices that are specially configured to store and perform program instructions (e.g., programming modules), such as read-only memory (ROM), random access memory (RAM), flash memory, etc.

Examples of program instructions include machine code instructions created by assembly languages, such as a compiler, and code instructions created by a high-level programming language executable in computers using an interpreter, etc. The described hardware devices may be configured to act as one or more software modules in order to perform the operations and methods described above, or vice versa.

While the present invention has been particularly shown and described with reference to certain embodiments thereof, it will be understood by those of ordinary skill in the art that various changes in form and details may be made therein without departing from the spirit and scope of the present invention as defined by the following claims and their equivalents.

What is claimed is:

1. An electronic device comprising:
a temperature sensor;
a power amplifier (PA); and
a processor configured to:
determine a transmission power of the PA,
determine whether the determined transmission power is less than or equal to a preset threshold level, the preset threshold level being set to distinguish between a high power mode and a low power mode,
monitor, when the determined transmission power is less than or equal to the preset threshold level, signals from the temperature sensor,
determine a bias value for the PA, based on the monitored signals, and
control the PA to amplify a signal for transmission based on the determined bias value,
wherein the processor is further configured to select the bias value using a temperature-based compensation table including bias values that vary according to a plurality of temperatures, and
wherein the bias value is set to maintain a first amplification gain at a first temperature higher than a specified temperature and is set to maintain a second amplification gain higher than the first amplification gain at a second temperature lower than the specified temperature.

2. The electronic device of claim 1, further comprising a transceiver.

3. The electronic device of claim 2, wherein the processor is further configured to:
receive, from an external device via the transceiver, information regarding a transmission level; and
determine the transmission power based on the received information.

4. The electronic device of claim 2, wherein the processor is further configured to:
measure a feedback power output from a coupler configured to couple a signal output from the PA; and
determine the transmission power based on the measured feedback power.

5. The electronic device of claim 4, wherein the processor is further configured to:
compare a transmission output power that is set corresponding to the transmission level with the measured feedback power,
vary the determined bias value, when an error range of a result of the comparing is greater than or equal to a threshold value, and
maintain the determined bias value when the error range is less than a threshold value.

6. The electronic device of claim 1, wherein the processor comprises at least one of an application processor and a communication processor.

7. The electronic device of claim 1, wherein the processor is further configured to:
measure an offset condition,
adjust the determined bias value, based on the measured offset condition, and
drive the PA with the adjusted bias value.

8. The electronic device of claim 7, wherein the offset condition comprises at least one of a battery status, a received signal status, a direct current (DC)-DC voltage, a transmission feedback power, and a PA load.

9. The electronic device of claim 1, further comprising an antenna configured to transmit the amplified signal.

10. A method of controlling transmission power, the method comprising:
determining a transmission power of a power amplifier (PA);
determining whether the determined transmission power is less than or equal to a preset threshold level, the preset threshold level being set to distinguish between a high power mode and a low power mode;
monitoring, when the determined transmission power is less than or equal to the preset threshold level, a temperature surrounding the PA;
determining a bias value for the PA based on the monitored temperature; and
controlling the PA to amplify a signal for transmission based on the determined bias value,
wherein determining the bias value comprises selecting the bias value using a temperature-based compensation table including bias values that vary according to a plurality of temperatures, and
wherein the bias value is set to maintain a first amplification gain at a first temperature higher than a specified temperature and is set to maintain a second amplification gain higher than the first amplification gain at a second temperature lower than the specified temperature.

11. The method of claim 10, wherein determining the transmission power comprises:
receiving, from an external device, via a transceiver, information regarding a transmission level; and
determining the transmission power based on the received information.

12. The method of claim 11, wherein determining the transmission power further comprises:
measuring a feedback power output from a coupler configured to couple a signal output from the PA; and
determining the transmission power based on the measured feedback power.

13. The method of claim 12, further comprising:
comparing a transmission output power that is set corresponding to the transmission level with the measured feedback power;
varying the determined bias value, when an error range of a result of the comparing is greater than or equal to a threshold value; and
maintaining the determined bias value when the error range is less than the threshold value.

14. The method of claim 10, further comprising:
measuring an offset condition,
adjusting the determined bias value based on the measured offset condition, and
driving the PA with the adjusted bias value.

15. The method of claim 14, wherein the offset condition comprises at least one of a battery status, a received signal status, a direct current (DC)-DC voltage, a transmission feedback power, and a PA load.

* * * * *